(12) United States Patent
Richardson et al.

(10) Patent No.: US 7,127,659 B2
(45) Date of Patent: Oct. 24, 2006

(54) MEMORY EFFICIENT LDPC DECODING METHODS AND APPARATUS

(75) Inventors: Tom Richardson, South Orange, NJ (US); Vladimir Novichkov, Towaco, NJ (US)

(73) Assignee: QUALCOMM Incorporated, San Diego, CA (US)

( * ) Notice: Subject to any disclaimer, the term of this patent is extended or adjusted under 35 U.S.C. 154(b) by 255 days.

(21) Appl. No.: 10/909,753

(22) Filed: Aug. 2, 2004

(65) Prior Publication Data

US 2006/0026486 A1 Feb. 2, 2006

(51) Int. Cl.
*H03M 13/00* (2006.01)

(52) U.S. Cl. ........................ 714/758; 714/804

(58) Field of Classification Search ............... 714/781, 714/752, 703, 759, 758, 804; 713/703
See application file for complete search history.

(56) References Cited

U.S. PATENT DOCUMENTS

| | | | |
|---|---|---|---|
| 3,542,756 A | 11/1970 | Gallager | |
| 3,665,396 A | 5/1972 | Forney, Jr. | |
| 4,295,218 A | 10/1981 | Tanner | |
| 5,157,671 A | 10/1992 | Karplus | |
| 5,271,042 A | 12/1993 | Borth et al. | |
| 5,293,489 A | 3/1994 | Furui et al. | |
| 5,313,609 A | 5/1994 | Baylor et al. | |
| 5,396,518 A | 3/1995 | How | |
| 5,457,704 A | 10/1995 | Hoeher et al. | |
| 5,526,501 A | 6/1996 | Shams | |
| 5,615,298 A | 3/1997 | Chen | |
| 5,671,221 A | 9/1997 | Yang | |
| 5,860,085 A | 1/1999 | Stormon et al. | |
| 5,864,703 A | 1/1999 | van Hook et al. | |
| 5,867,538 A | 2/1999 | Liu | |
| 5,892,962 A | 4/1999 | Cloutier | |
| 5,933,650 A | 8/1999 | van Hook et al. | |
| 5,968,198 A | 10/1999 | Hassan | |
| 6,002,881 A | 12/1999 | York et al. | |
| 6,073,250 A | 6/2000 | Luby et al. | |
| 6,195,777 B1 | 2/2001 | Luby et al. | |
| 6,247,158 B1 | 6/2001 | Smallcomb | |
| 6,266,758 B1 | 7/2001 | van Hook et al. | |
| 6,298,438 B1 | 10/2001 | Thayer et al. | |

(Continued)

OTHER PUBLICATIONS

T. Richardson and R. Urbanke, "The Capacity of Low-Density Parity-Check Codes under Message-Passing Decoding", pp. 1-44 (Mar. 2001).

(Continued)

*Primary Examiner*—David Ton
(74) *Attorney, Agent, or Firm*—Straub & Pokotylo; Michael P. Straub

(57) ABSTRACT

Methods and apparatus for implementing memory efficient LDPC decodes are described. In accordance with the invention message information is stored in a compressed state for check node processing operations. The state for a check node is fully updated and then subject to an extraction process to generate check node to variable node messages. The signs of messages received from variable nodes may be stored by the check node processor module of the invention for use in message extraction. The check node processor can process messages in variable node order thereby allowing the variable node processor and check node processor to operate on messages in the same order reducing or eliminating the need to buffer and/or reorder messages passed between check nodes and variable nodes. Graph structures which allow check node processing on one graph iteration to proceed before the previous graph iteration has been completed are also described.

36 Claims, 8 Drawing Sheets

U.S. PATENT DOCUMENTS

| | | | |
|---|---|---|---|
| 6,339,834 | B1 | 1/2002 | Crozier et al. |
| 6,397,240 | B1 | 5/2002 | Fernando et al. |
| 6,438,180 | B1 | 8/2002 | Kavcic et al. |
| 6,473,010 | B1 | 10/2002 | Viyaev et al. |
| 6,484,284 | B1 | 11/2002 | Smallcomb |
| 6,526,538 | B1 | 2/2003 | Hewitt |
| 6,633,856 | B1 | 10/2003 | Richardson et al. |
| 6,718,504 | B1 | 4/2004 | Coombs et al. |
| 6,731,700 | B1 | 5/2004 | Yakhnich et al. |
| 6,751,770 | B1 * | 6/2004 | Morelos-Zaragoza ....... 714/781 |
| 6,754,804 | B1 | 6/2004 | Hudepohl et al. |
| 6,842,872 | B1 * | 1/2005 | Yedida et al. ................ 714/703 |
| 6,938,196 | B1 * | 8/2005 | Richardson et al. ........ 714/752 |
| 6,957,375 | B1 * | 10/2005 | Richardson ................. 714/752 |
| 2004/0034828 | A1 | 2/2004 | Hocevar |

OTHER PUBLICATIONS

Saied Hemati, Amir H. Banihashemi, VLSI Circuits: Iterative decoding in analog CMOS, Proceedings of the 13$^{th}$ ACM Great Lakes Symposium on VLSI Apr. 2003, pp. 15-20.

Mohammad M. Mansour, Naresh R. Shanbhag, Session 11: Low-power VLSI decoder architectures for LDPC codes, Proceedings of the 2002 international symposium on Low power electronics and design Aug. 2002, pp. 284-289.

Richardson et al. "The capacity of low-density parity-check codes under message-passing Decoding", IEEE Transactions on Information Theory; pp. 599-618, Feb. 2001, (same inventor) whole document.

Paranchych et al. "Performance of a digital symbol synchronizer in cochannel interference and noise", IEEE Transactions on Communications, pp. 1945-1954; Nov. 2000, whole document.

Sorokine, V. et al. "Innovative coding scheme for spread-spectrum communications", The Ninth IEEE International Symposium on Indoor and Mobile Radio Communications, pp. 1491-1495, vol. 3; Sep. 1998, whole document.

NN77112415. "Digital Encoding of Wide Range Dynamic Analog Signals", IBM Tech. Disclosure Bulletin, Nov. 1, 1997, vol. No. 20; Issue No. 6; pp. 2415-2417, whole document.

NN9210335. "Hierarchical Coded Modulation of Data with Fast Decaying Probability Distributions", IBM Tech. Disclosure Bulletin, Oct. 1992, vol. No. 35; Issue No. 5; pp. 335-336, whole document.

T. Richardson and R. Urbanke, "An Introduction to the Analysis of Itetrative Coding Systems", pp. 1-36.

T. Richardson, A. Shokrollahi, R. Urbanke, "Design of Capacity-Approaching Irregular Low-Density Parity-Check Codes", pp. 1-43 (Mar. 2001).

T. Moors and M. Veeraraghavan, "Preliminary specification and explanation of Zing: An end-to-end protocol for transporting bulk data over optical circuits", pp. 1-55 (May 2001).

R. Blahut, "Theory and Practice of Error Control Codes", Library of Congress Cataloging in Publication Data, pp. 47-49, (May 1984).

W. W. Peterson and E.J. Weldon, Jr., "Error-Correcting Codes", Second Edition, The Massachusetts Institute of Technology, pp. 212-213,261-263, 263, (1986).

* cited by examiner $$H = \begin{bmatrix} 1 & 1 & 1 & 1 & 1 & 1 & 1 & 0 & 0 & 0 \\ 0 & 0 & 1 & 1 & 1 & 0 & 0 & 1 & 1 & 0 \\ 0 & 1 & 0 & 1 & 0 & 1 & 0 & 1 & 0 & 1 \\ 1 & 0 & 0 & 1 & 0 & 1 & 1 & 0 & 1 & 1 \\ 1 & 1 & 0 & 0 & 1 & 0 & 1 & 1 & 0 & 1 \\ 1 & 0 & 1 & 0 & 1 & 1 & 0 & 0 & 1 & 1 \end{bmatrix}$$

202

$$X = \begin{bmatrix} X_1 & X_2 & X_3 & X_4 & X_5 & X_6 & X_7 & X_8 & X_9 & X_{10} \end{bmatrix}$$

MEMORY EFFICIENT LDPC DECODING METHODS AND APPARATUS

BACKGROUND OF THE INVENTION

Nearly all forms of electronic communication and storage systems use error-correcting codes. Error correcting codes compensate for the intrinsic unreliability of information transfer in these systems by introducing redundancy into the data stream. The mathematical foundations of error correcting were established by Shannon. Shannon developed the mathematical concept of the channel in which distortion of signals in communications systems is modeled as a random process. The most fundamental result of Shannon is the Noisy channel theorem, which defines for the channel a capacity, a quantity that specifies the maximum rate at which information can be reliably delivered through the channel. Reliable transmission at rates approaching capacity requires the use of error correcting codes. Thus, error-correcting codes are designed to achieve sufficient reliability while approaching capacity as closely as possible. The complexity of implementing the error correcting code is an additional factor that comes into play in practical applications of error correcting codes. Recent advances in error correcting coding systems resulting from the invention of turbo codes and the subsequent rediscovery and development of low-density parity-check (LDPC) codes offer coding systems of feasible complexity that can approach Shannon's capacity quite closely.

LDPC codes are well represented by bipartite graphs, often called Tanner graphs, such as the graph 100 shown in FIG. 1. In Tanner graphs in one set of nodes, the variable nodes 102, corresponds to bits of the codeword and the other set of nodes, the constraint nodes 106, sometimes called check nodes, correspond to the set of parity-check constraints which define the code. Edges 104 in the graph connect variable nodes to constraint nodes. A variable node and a constraint node are said to be neighbors if they are connected by an edge in the graph. One typically assumes that a pair of nodes is connected by at most one edge. LDPC codes can equivalently be represented using the parity check matrix 202. FIG. 2 presents an example of a parity matrix representation where the indicated vector x 208 is a codeword if and only if Hx=0.

To each variable node is associated one bit of the codeword. In some cases some of these bits might be punctured. Punctured bits may be desirable in certain code structures and they are excluded from the transmitted codeword.

A bit sequence associated one-to-one with the variable node sequence is a codeword of the code if and only if, for each constraint node, the bits neighboring the constraint (via their association with variable nodes) sum to zero modulo two, i.e., they comprise an even number of ones.

The decoders and decoding algorithms used to decode LDPC codewords operate by exchanging messages within the graph along the edges and updating these messages by performing computations at the nodes based on the incoming messages. Such algorithms will be generally referred to as message passing algorithms. Each variable node in the graph is initially provided with a soft bit, termed a received value, that indicates an estimate of the associated bit's value as determined by observations from, e.g., the communications channel. Ideally, the estimates for separate bits are statistically independent. This ideal can be, and often is, violated in practice. A collection of received values constitutes a received word. For purposes of this application we may identify the signal observed by, e.g., the receiver in a communications system, with the received word.

The number of edges attached to a node, i.e., a variable node or constraint node, is referred to as the degree of the node. A regular graph or code is one for which all variable nodes have the same degree, j say, and all constraint nodes have the same degree, k say. In this case we say that the code is a (j,k) regular code. These were the codes considered originally by Gallager (1961). In contrast to a "regular" code, an irregular code has constraint nodes and/or variable nodes of differing degrees. For example, some variable nodes may be of degree 4, others of degree 3 and still others of degree 2.

While irregular codes can be more complicated to represent and/or implement, it has been shown that irregular LDPC codes can provide superior error correction/detection performance when compared to regular LDPC codes.

It will be appreciated that received words generated in conjunction with LDPC coding, can be processed by performing LDPC decoding operations thereon, e.g., error correction and detection operations, to generate a reconstructed version of the original codeword. The reconstructed codeword can then be subject to data decoding to recover the original data that was coded. The data decoding process may be, e.g., simply selecting a specific subset of the bits from the reconstructed codeword.

As mentioned above, LDPC decoding operations generally comprise message passing algorithms. There are many potentially useful message passing algorithms and the use of such algorithms is not limited to LDPC decoding To facilitate understanding of the invention discussed in the sections which follow, we will now give a brief mathematical description of belief propagation.

Belief propagation for (binary) LDPC codes can be expressed as follows. Messages transmitted along the edges of the graph are interpreted as log-likelihoods log $$\frac{p_0}{p_1}$$

for the bit associated to the variable node. Here, $(p_0, p_1)$ represents a conditional probability distribution on the associated bit where $p_x$ denotes the probability that the bit takes the value x. The soft bits provided to the decoder by the receiver are also given in the form of a log-likelihood. Thus, the received values, i.e., the elements of the received word, are log-likelihoods of the associated bits conditioned on the observation of the bits provided by the communication channel. In general, a message m represents the log-likelihood m and a received value y represents the log-likelihood y. For punctured bits the log-likelihood received value y is set to 0, indicating $p_0 = p_1 = \frac{1}{2}$.

Let us consider the message-passing rules of belief propagation. Messages are denoted by $m^{C2V}$ for messages from check nodes to variable nodes and by $m^{V2C}$ for messages from variable nodes to check nodes. Consider a variable node with d edges. For each edge j=1, . . . ,d let $m^{C2V}(i)$ denote the incoming message on edge i. At the initialization of the decoding process we set $m^{C2V}=0$ for every edge. In general, outgoing messages from variable nodes are given by $$m^{V2C}(j) = y + \left(\sum_{i=1}^{d} m^{C2V}(i)\right) - m^{C2V}(j).$$

The outgoing decoded soft value from a node (not an edge message) corresponding to this operation is given by $$x_{out} = y + \left(\sum_{i=1}^{d} m^{C2V}(i)\right).$$

The outgoing hard decision associated to this output is obtained from the sign of $x_{out}$.

At the check nodes it is often more convenient to represent the messages using their 'sign' and magnitudes. Thus, for a message m let $m_p \in GF[2]$ denote the 'parity' of the message, i.e., $m_p=0$ if $m \geq 0$ and $m_p=1$ if $m<0$. Additionally let $m_r \in [0,\infty]$ denote magnitude of m. Thus, we have $m=-1^{m_p} m_r$. At the check node the updates for $m_p$ and $m_r$ are separate. We have, for a check node of degree d, $$m_p^{C2V}(j) = \left(\sum_{i=1}^{d} m_p^{V2C}(i)\right) - m_p^{V2C}(j),$$

where all addition is over GF[2], and $$m_r^{C2V}(j) = F^{-1}\left(\left(\sum_{i=1}^{d} F(m_r^{V2C}(i))\right) - F(m_r^{V2C}(j))\right),$$

where addition is real and we define $F(x):=\ln \coth (x/2)$. We note that F is its own inverse, i.e., $F^1(x)=F(x)$.

An algorithm often mentioned in LDPC literature is the so-called MIN-SUM algorithm. In this algorithm the update operation at check nodes can be expressed mathematically as $$m_r^{C2V}(j) = \min \{(U^d_{i=1} m_r^{V2C}(i)) \backslash m_r^{V2C}(j)\}.$$

Thus, the reliability of a C2V message is equal to the minimum reliability of the V2C messages incoming along other edges. To implement this algorithm it is sufficient to save at the check node the smallest and second smallest reliability (they may be the same value if that value occurs for at least two incoming messages) and the identity of the edge providing the incoming message of least reliability. The reliability of the outgoing C2V message on the edge originating the least reliable incoming message is equal to the second smallest incoming reliability and the reliability of the outgoing C2V message on all other edges is equal to the smallest reliability.

In the U.S. Pat. No. 6,633,856 an LDPC decoder architecture was described. In that architecture the messages being sent from check nodes to variable nodes were stored in memory. If the messages comprise 5 bits, for example, and a check node has degree K, then the storage used for those messages is 5K bits.

From an implementation and cost standpoint it is generally desirable to implement an LDPC decoder in a manner that is relatively simple to construct and requires a relatively small amount of hardware. Memory is a major component in many decoder designs. It would be desirable if the amount of memory required to implement a decoder could be keep to a low or minimal amount to thereby reduce hardware costs.

While memory reduction is of a concern, in reducing the amount of memory used, it is often necessary to avoid a design which would impose unacceptable processing delays which might result in the failure to meet one or more real world decoding time constraints.

In view of the above discussion, it should be apparent that memory efficient methods and apparatus which can be used to simply the implementation of LDPC decoders and/or produce an LDPC decoder capable of performing decoding operations with a relatively small amount of memory would be desirable. In addition, methods for avoiding the introduction of extensive delays into an LDPC decoding process using a memory efficient decoder implementation are desirable and would be beneficial.

SUMMARY OF THE INVENTION

The present invention is directed to methods and apparatus for performing LDPC decoding operations in a memory efficient manner. Various features of the present invention are directed to check node processing methods and apparatus which are implemented in a memory efficient manner, e.g., using one or more message information compression and/or decompression techniques. Additional features of the present invention are directed to avoiding and/or reducing delays in memory efficient LDPC decoders, e.g., decoder of the type described in the present application, by the use of LDPC codes with a code structure that avoids introducing significant delays into the decoding process.

The inventor of the present application realized that check node computation in LDPC decoders has the property that outgoing reliabilities take on only two values and one of those values goes out along only one edge and that this property could be used to efficiently store check node message information and to efficiently implement a check node processor module. Using this property, the full message for each edge need not be stored during check node processing with the storage being reduced to the amount that will be needed for processing and to construct the output messages when check node processing corresponding to a node has been completed. By using message compression, the storage requirement for a check node processor module, in many cases, can be substantially reduced as compared to implementations where message compression is not used in accordance with the invention.

Various features of the present invention are directed to check node processing modules. The processing modules store message information corresponding to the messages associated with each check node in a compressed format. To do this a check node state memory including, e.g., one entry per check node, is used. The state information for a check node includes information generated from the input messages to that particular check node rather than a complete set of messages for the check node. Thus the state information represents a compressed set of message information. The compressed information corresponding to each check node is updated as each input message, e.g., variable node to check node message, is received. Input messages can be received in any order, e.g., the input messages for each individual check node need not be received and processed consecutively. Thus, in accordance with the invention an input message corresponding to one check node can be processed, followed by an input message corresponding to another check node, without first receiving all the input messages for the other check node. This allows for variable to check node messages to be received and processed in variable node edge order as opposed to the order at which the edges appear at the check node side of the LDPC graph. Thus, assuming processing of messages at the variable node processing element in variable node order, there is no need to re-order the generated messages prior to processing at the check node processing module of the invention.

After the full set of variable node to check node messages corresponding to an individual check node is processed, the compressed message information corresponding to the full set of messages associated with a check node is accessed and processed, e.g., subject to a decompression process also referred to herein as an extraction processes. The extraction process generates the full set of check node to variable node messages which are to be produced by the individual check node, e.g., as dictated by the particular code structure being implemented and the individual check node's position within that code structure.

In some embodiments, the stored state for each check node includes two values, e.g., first and a second values. These values may be message magnitude values. The state also includes edge position information associated with one of the values. This information represents the state used to generate the magnitude portion of outgoing message produced by the particular check node. In addition to the message magnitude information which represents reliability information, for each check node an accumulated sign bit value is stored. The accumulated sign bit is generated by XORing the sign bit of each input message to the check node which is processed with the last generated accumulated sign bit value to generate the sign bit for each output message.

In one particular embodiment, additional sign bit information is stored for each input message that is received corresponding to a check node. In such an embodiment the input sign bit is stored from each message received on a check node edge. Thus, in such an embodiment, in addition to an accumulated sign bit for each check node, an input sign bit is stored for each check node edge, where each edge corresponds to a different input message.

While the full set of input messages corresponding to an individual check node need to be processed before output messages from the particular individual check node are generated, by using a code structure where check nodes do not receive input messages from variable nodes which will be processed much later during the decoding process, the output messages for at least some check nodes can be generated without having to process the messages from the full set of variable nodes present in the implemented graph structure. By using a code which takes into consideration the benefits of making the processing of check nodes occurring in one part of a graph so that they do not depend on messages from variable nodes which will be processed much later, timing delays associated with check node output message generation can be reduced and/or minimized.

Check node output messages for a check node may be generated once the full set of input messages, e.g., one input message for each check node edge, has been processed. To generate a check node output message, which serves as an input message to a variable node, the check node processing module of the present invention reads the check node state associated with the check node for which the output message. From the stored magnitude state information, e.g., first and second magnitude values and edge identifier, the check node processing module processes the state to extract, e.g., generate, a complete output message for one edge, e.g., a check node to variable node message. The process will be repeated for each edge of the check node until a full set of output message is generated. The processing of the check node state information is, in effect, a decompression operation.

In some embodiments the min sum algorithm is used to store check node message magnitude (reliability) information in a compressed state. In such embodiments, for each check node a minimum message magnitude value, a second minimum message magnitude value and information indicating the edge to which the minimum message magnitude value corresponds is stored. This information is in addition to the accumulated sign bit information. This information is updated each time an input message corresponding to the particular check node to which the information correspond is received until each of the input messages for the particular check node have been processed.

To generate the magnitude portion of an outgoing message corresponding to an edge, the edge is compared to the stored edge identifier which indicates the edge on which the minimum message value was received. If the edge for which the outgoing message is being generated does not match the stored edge identifier, the minimum message value is used as the magnitude of the outgoing message. If the stored edge identifier matches the edge for which the outgoing message is being generated, the second minimum value is used as the outgoing message value. Thus, the magnitudes of outgoing messages generated by a check node will either have the minimum value or the second minimum value with the second minimum value being output on the single edge which supplied the minimum magnitude value that was received by the check node.

Computationally, this amounts to performing a multiplexing (selecting) operation between two possible reliabilities, A and B, where A and B are the two possible outgoing magnitude values, e.g., the minimum or second minimum received message magnitude value received by the particular check node. The second outgoing magnitude value B is selected for the magnitude portion of the outgoing message if the edge (variable to check node connection) matches the stored edge index indicating the edge on which the magnitude value A (the minimum value) was received. Otherwise the minimum magnitude value A is output.

The sign bit for an outgoing message may be generated in a variety of ways. In one particular exemplary embodiment. The accumulated sign bit value corresponding to a check node is combined, e.g., XORed, with the stored received sign bit value corresponding to the edge for which the outgoing message is being generated to produce the sign bit value of the outgoing message for that edge. This process is repeated, like the magnitude generation portion of the outgoing message generation process for each edge for which an outgoing message is generated.

From an implementation standpoint, the check node processing method of the present invention has the advantage of reducing the amount of memory required to implement check node processing through the use of message compression. From an implementation standpoint, this can be significant particularly in cases where check nodes may large numbers of edges as is the case with many robust LDPC codes in use today and likely to be used in the future.

For example consider the case of 5 bit messages which are include 1 sign bit and 4 magnitude bits. Under the above assumptions the output information from the check node can be compressed to approximately K+8+log$_2$ K bits, where K is the number of incoming and outgoing messages. In the 5 bit message example, K storage bits will be used to store the sign bits corresponding to each of the K input messages, 8 bits will be used for storing each of the two possible magnitude values which the output messages may assume, e.g., the minimum input message magnitude and the next smallest input message magnitude value, and log$_2$ K bits are used to indicate the edge (message) that is to receive the second reliability value while the other edges will receive the minimum input message magnitude value. If K is large, which will be the case for high rate LDPC codes, then use of this message information storage technique can result in a substantial savings as compared to implementations which store the full sets of bits corresponding to each received message as part of the process of generating output messages.

While, some additional processing is required to generate outgoing messages from the stored state, e.g., min message magnitude, second min message magnitude, edge position corresponding to the min message magnitude, and stored sign bits corresponding to each of the edges, as compared to embodiments where complete messages are stored, but, in return, there may be substantial memory savings.

The check node processing module of the present invention has the additional advantage that variable to check node messages which serve as the input to the check node processing module can be received and processed without regard to a particular message processing order. Output messages are generated after each of the input messages to a check node have been processed.

Numerous additional features and benefits of the invention will be apparent from the detailed description which follows.

BRIEF DESCRIPTION OF THE DRAWINGS

FIG. 2 is alternative representation of the LDPC code of FIG. 1 which shows the code through the use of a matrix representation as an alternative to the graph representation shown in FIG. 1.

DETAILED DESCRIPTION

Figure 1:
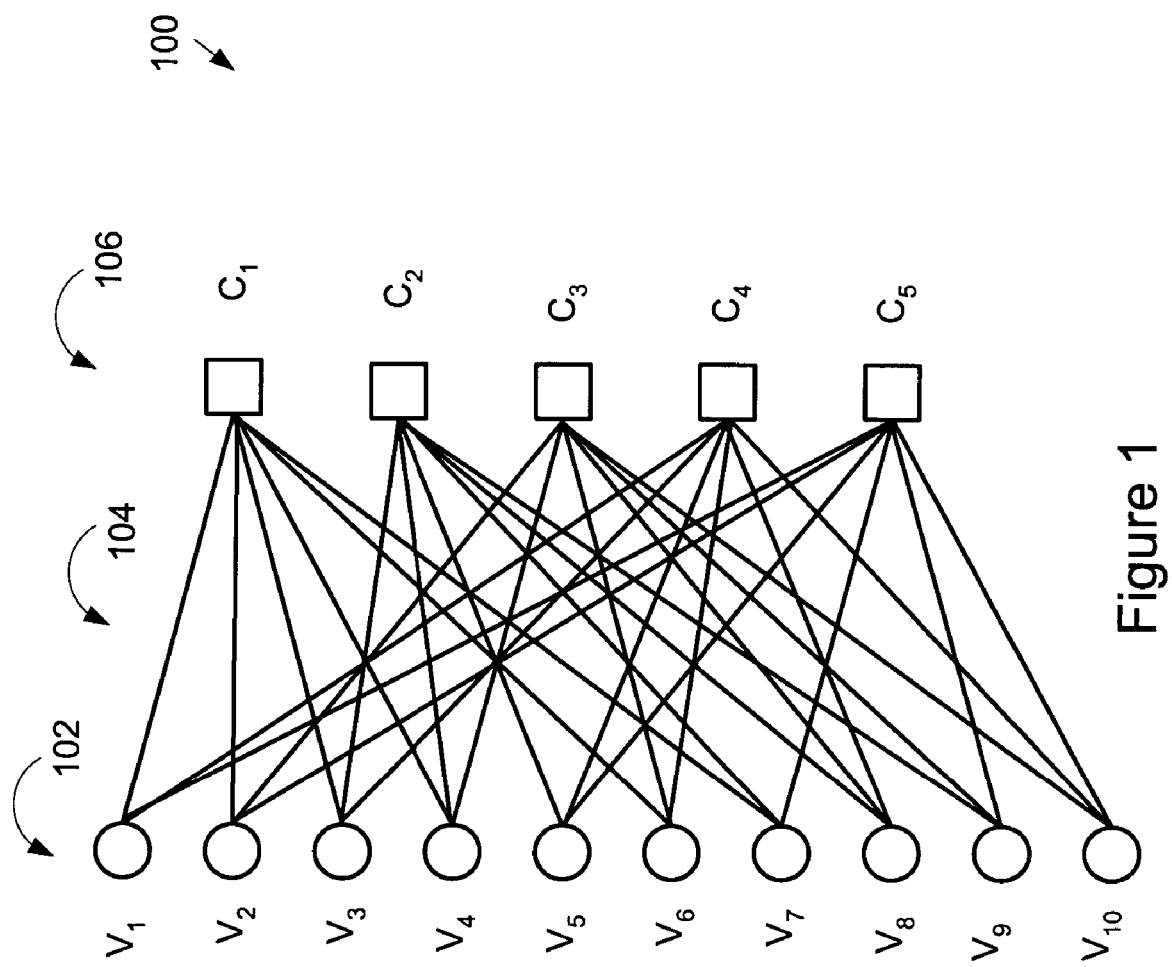
FIG. 1 is a graph illustrating an exemplary LDPC code including ten variable nodes and five check nodes.

The following (3) related applications are hereby expressly incorporated by reference and are to be considered part of the present application: U.S. patent application Ser. No. 09/975,331 filed Oct. 10, 2001 entitled "METHODS AND APPARATUS FOR DECODING LDPC CODES", U.S. patent application Ser. No. 10/117,264 filed Apr. 4, 2002 entitled "NODE PROCESSORS FOR USE IN PARITY CHECK DECODERS", and U.S. patent application Ser. No. 10/618,325 filed Jul. 11, 2003 entitled "METHODS AND APPARATUS FOR ENCODING LDPC CODES".

Various embodiments of the present invention are directed to methods and apparatus which provide a simple, e.g., low hardware complexity, implementation of an LDPC decoder architecture. The methods and apparatus of the invention take advantage of the observation that, for certain algorithms, the reliabilities sent out from a check node take on one of two possible values and one of those values is sent along only one message edge. This is the case, for example, for the min-sum algorithm. The same conditions can exist for other algorithms which can be used to store LDPC message information in a compressed form, e.g., algorithms that share with the min-sum algorithm the property that the reliabilities sent out from a check node take on only two possible values and one of those values is sent along just one message edge attached to a check node.

In accordance with the invention, associated with each check node in an LDPC code structure being used to control decoding is a state S. The state will include the reliability (message magnitude) information of incoming messages in a current decoding iteration that will be used to generate outgoing messages. Let $S_k$ denote the state assuming that messages $m_1, \ldots, m_k$ have been incorporated. Then, given a state update function G, the updated state for a given check node resulting after processing of a received variable to check node message corresponding to a check node can be expressed as:

$$S_{k+1} = G(m_{k+1}, S_k).$$

In accordance with various embodiments of the invention, the state update operation is performed on state which represents the magnitude portion of a plurality of messages corresponding to a check node in a compressed form. Thus, the state update operation compresses the incoming messages.

In the case of an implementation which uses the MIN-SUM algorithm to store message information in a compressed format, the stored message state may be, for example, in the form of ($m_A$, $m_B$, A, s). Where $m_A$ is the minimum incoming reliability (message magnitude) seen so far by a check node to which the state corresponds, $m_B$ is the second smallest reliability seen so far, A indexes the edge that carried the incoming message of reliability $m_A$ thereby indicating which message edge supplied the minimum value $m_A$, and s is the XOR of the signs of the incoming messages corresponding to the check node to which the state information corresponds.

By performing updates on state information corresponding to check nodes using the function G, and by providing an decoder implementation where state corresponding to individual check nodes can be stored and retrieved for updating with incoming messages as a function of which check node the message is directed to, then the order of messages coming into a check node processor can be essentially arbitrary. Thus, in accordance with the invention variable to check node messages can arrive in variable node order at the check node processor module with the messages being processed in the order they are received. This allows LDPC decoders, such as the decoders 400 and 500 illustrated in FIGS. 4 and 5, implemented in accordance with the invention where both sides (variable node and check node which are implemented as variable node and check node processors, respectively to be updated in variable node order. Further more, both variable node and check node processing elements can, and do, operate in parallel, e.g., simultaneously, in some embodiments.

Such decoder implementations of the present invention allow for substantial savings in memory requirements when compared to decoder implementations where variable node processing is performed in variable node message order and check node processing is performed in check node message order and a memory is used to store and allow for the reordering of messages being passed between the check node and variable node processors.

Having described some of the basic principles and benefits of the LDPC decoder design of the present invention, various exemplary modules and LDPC decoders which implement one or more features of the present invention will now be described.

Figure 3:
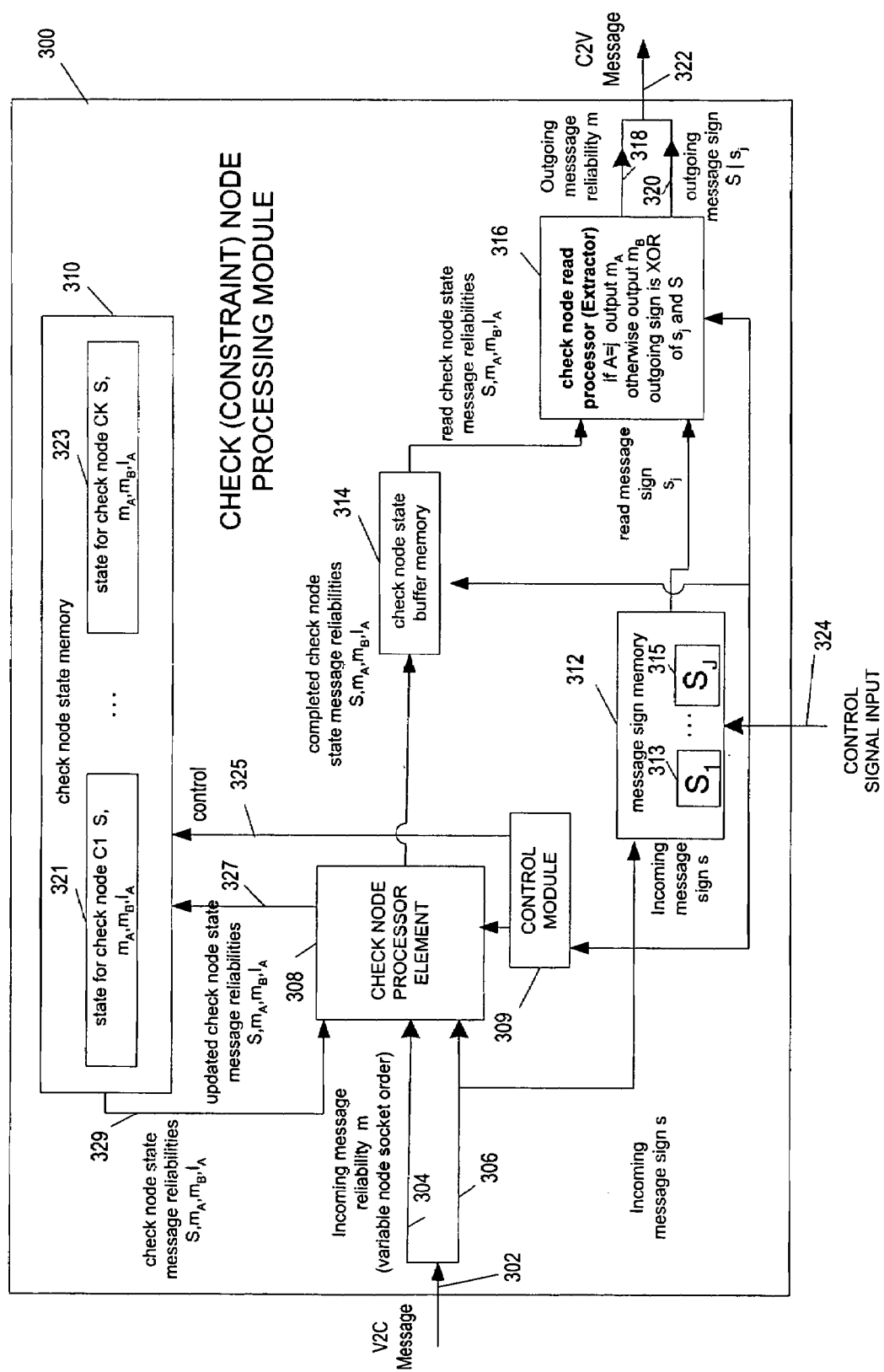
FIG. 3 illustrates a constraint node processing module implemented in accordance with the invention.

FIG. 3 illustrates a check node processing module 300, also known as a constraint node processing module, implemented in accordance with the present invention. The module 300 receives variable to check node (V2C) messages via input 302, control information via a control signal input 324 and generates check node to variable node (C2V) messages which are output via output 322. The check node processing module 300 stores message information which can be used to generate check node to variable node messages in a compressed format.

The check node processing module 300 includes a check node state memory module 310, a control module 309, a check node processor element 308, message sign memory 312, a check node state buffer memory 314 and check node extractor 316 which are coupled together as shown in FIG. 3. In the illustrated embodiment, the sign value for each received V2C message is separated from the magnitude value. The magnitude message value is supplied to the check node processor 308 via input 304 while the sign value corresponding to each received message supplied to the check node processor element 308 and is also stored in message sign memory 312 which stores the sign bit to be used later in generating outgoing C2V messages from stored state 321, 323.

The check node state memory 310 includes, for each check node in the code structure which is being used to control decoding, a single state memory element 321, 323 which is used to store the state for the particular check node to which the memory element corresponds. Each check node state memory 321, 323 store state information corresponding to one check node corresponding to an LDPC graph structure used to control decoding.

In the FIG. 3 example, state is stored in a compressed representation corresponding to the min sum algorithm discussed above. The entry is reset at the start of check node processing corresponding to the entry for each processing iteration corresponding the edge messages included in one complete representation of the LDPC graph being used to control decoding. Processing of check nodes from one iteration to another iteration of the graph may occur prior to completion of the first iteration, e.g., once the full set of variable nodes corresponding to one check node in the graph has been completed. In such a case, resetting of all the sets of check node state information 321, 323 will not occur at the same time. Rather, the check node state corresponding to a check node will be fully updated and then reset after being supplied to check node state buffer memory for use in generating C2V messages.

Each state entry 321, 323 corresponds to one check node in the graph structure being used to control decoding. Each state entry 321, 323 includes S, a one bit value which is the XOR of the sign bits corresponding each received V2C message directed to the check node to which the entry corresponds, a minimum value $m_A$ indicating the minimum received message magnitude corresponding to the particular check node, the second minimum message magnitude value $m_B$ corresponding to the particular check node, and an index $I_A$ indicating the message edge on which the lowest minimum value $m_A$, was received.

Control signal input 324 receives a control signal which is used to control operation of the check node processing module as a function of the code structure used to control decoding, e.g., as a function of the number of graph edges and thus messages which will be passed between the variable and check node processing elements. Control signal 324 includes information indicating which edge, and thus which V2C message is being received at input 302 at a particular time. This same signal can be used to drive C2V message generation in cases where there is a fixed or known relationship between V2C input message timing and the desired C2V output message timing which will normally be the case. The control signal 324 is supplied to the control module 309, message sign memory 312 and check node read processor (extractor) 316. The control module 309 uses the received control signal to determine which check node a received V2C message corresponds. Based on the received control information, the control module determines which set of check node state information 321, 323 to read out from the check node state memory 310 for updating. Thus, control module determines based on the edge information the check node to which the receive message corresponds. Once the check node processor updates the retrieved state information by using the received message information as will be discussed below, the updated state is written back into the check node state entry 321, 323 from which the state to be updated was retrieved. This process will continue until the control module 309 signals to the check node processor element 308 that the check node state for a particular check node has been fully updated using the last V2C message directed to the check node during the particular processing iteration. With the state for the check node being fully updated, the check node processor will reset the values in the check node state by writing default values into the check node state and output the fully updated check node state to the check node state buffer 314 to be used in message extraction. Check node state buffer memory 314 includes state entries for one or more check nodes which have the same content as entries 321, 323 but with the values corresponding to a set of fully updated state for the check node. Check node state buffer memory 314 knows what entry to store the fully updated check node information in bases on the control signal obtained from input 324.

The check node state memory 310 includes an updated check node state message input 327 for receiving state information to be stored and a control input 327 for receiving a control signal indicating which set of check node state information 321, 323 is to be accessed and whether updated state information is to be stored or read from the indicated set of check node state information. The check node state information 321 or 323 read from the check node state memory is output via output 329 and supplied to a state input of check node processor element 308 where it is used in a state update operation.

The state update operation performed by the check node processor 308 on a set of state information retrieved from memory as a function of information included in a received V2C message as follows: the magnitude $m_r$ of the received C2V message is compared to the minimum magnitude $m_A$ in the retrieved state information corresponding to the check node to which the received message is directed.

If $m_r$ is less the $m_A$ then: $m_B$ is set equal to $m_A$ to create the updated $m_B$ and $m_A$ is set equal to $m_r$ with $m_r$ thereby becoming the updated minimum and the previous minimum becoming the current second minimum for the check node. In addition the index I indicating the message edge to which the minimum $m_A$ corresponds to indicate the message edge on which the message being processed, e.g., the message providing the updated minimum magnitude value, was received.

If $m_r$ is less than $m_B$, but greater than $m_A$, then $m_B$ is set equal to $m_r$ without changing $m_A$ or I.

If $m_r$ is equal to or greater than $m_b$ the $m_A$, $m_B$ and I values read from memory are not altered and the updated state will include the values for these elements which were read out from memory.

Regardless of the relative magnitude of the received message value and stored minimums, the accumulated sign bit S for the check node will be updated with each received message by performing an XOR of the sign bit in the received message with the sign bit read from the stored check node state entry. The result of the XOR operation becomes the sign S bit of the updated entry for the check node which is written back into memory in the case of a check node which has not been fully updated or is supplied to the check node state memory buffer 314 in the case of a fully updated check node entry. As mentioned above, in the case of a fully updated check node entry, default values will be written into the check node's entry 321, 323 from which the check node state was read thereby resetting the information for another iteration of graph processing. The default values for the minimum $m_A$ and second minimum $m_B$ will normally be the maximum values these elements may assume.

Given the above described check node processing and state update technique, it should be apparent that check node processor element 308 can process variable to check node messages in an arbitrary order, e.g., in variable node as opposed to check node edge order. This allows the check node processor element 308 to processes V2C messages in the order they are naturally generated as a result of variable node processor operation given that variable node processors normally operate in variable node edge order.

Since the fully updated state information for a check node is in a compressed format representation of the information required to generate C2V output messages, additional processing is used to construct the actual C2V messages output via output 322. The check node read processor, e.g., extractor, 316 generates the complete C2V messages from the fully updated state stored in check node state memory 314 and the stored sign values which were stored in memory 312, one sign value 313, 315 being stored for each received V2C message.

Thus, to "read" a C2V message requires additional processing, as compared implementations where messages are not stored in a compressed format, in order to perform the decompression that would not be required if the compressed storage format was not used. Stored incoming message sign values 313, 315 are read directly from sign memory. Each sign value read from memory 312 is XORED with fully updated sum S corresponding to a check node to get the outgoing sign corresponding to a message edge associated with an outgoing C2V message. Thus, the outgoing sign for a message edge is generated from the message sign received on the message edge and the accumulated sign value S corresponding to the XOR of the full set of messages corresponding to the check node to which the message edge is attached in the LDPC graph. The reliability, e.g., message magnitude portion is extracted from the minimum, second minim and message index values included in the stored state for the check node. If the index of the edge being read matches A, then reliability $m_A$ is output, otherwise reliability $m_B$ is output. There are many possibilities for representing the index A which servers as a message edge identifier. While a simple edge number is one possible way of representing index A, other numbering schemes and/or edge indexing methods may be used as well.

The message magnitude generated by the message extractor 316 is output on magnitude output 318 while the outgoing message sign is output on output 320 which are combined to form the complete message output via output 322.

Having described the inventive check node processing module 300 of the present invention with regard to FIG. 3, the module's use in an exemplary LDPC decoder implement in accordance with the invention will now be described with reference to FIG. 4.

Figure 4:
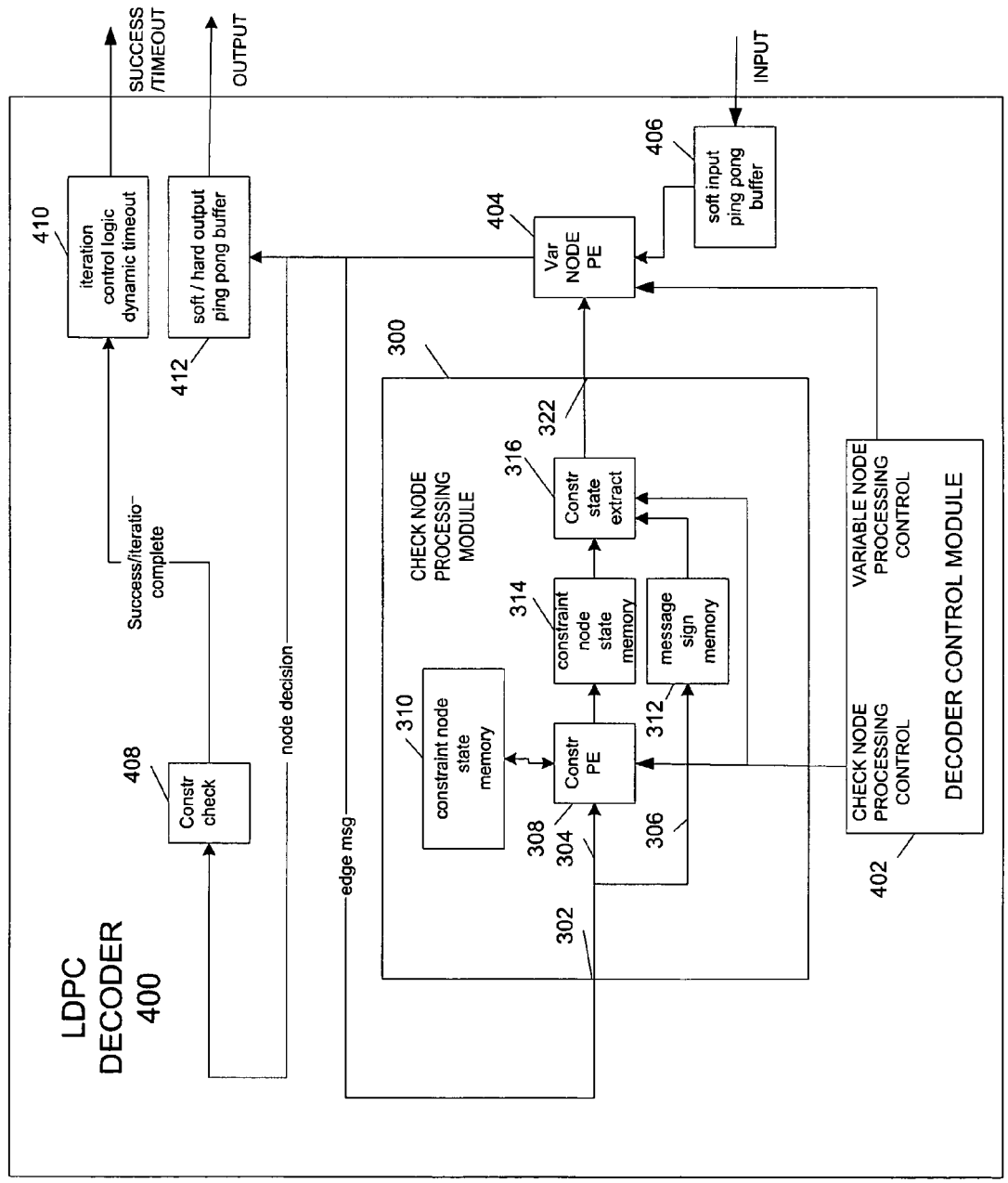
FIG. 4 illustrates an LDPC decoder implemented in accordance with the present invention.

FIG. 4 shows an exemplary LPDC decoder 400 implemented using the check node processing module 300 shown in FIG. 3. The decoder 400 performs both variable node processing and check node processing in variable node edge order. The decoder 400 includes, in addition to the check node processing module 300, a decoder control module 402, a variable node processing element 404, a soft input buffer 406, a soft/hard output buffer 412, a constraint check module 408 and an iteration control logic circuit 410.

Input values to be decoded are supplied to the soft input buffer 406 prior to loading in to the variable node processing element 404. Decoder control module 402 is responsible for generating decoder control signals in accordance with stored decoding control information corresponding to an LDPC graph structure to be used in controlling decoding operations. The decoder control module generates the control signals used to control check node processing module operation discussed above in regard to FIG. 3 as well as variable node processing element operation. Under the control of the decoder control module, the variable node processing element is sequentially loaded with portions the input data to be processed, e.g., a received message value including magnitude information and a sign bit. During the initial iteration, there are no existing constraint messages to be processed by the variable node PE 404 and V2C messages are generated by processing the input data. V2C messages are generated and output from the input data in variable node message edge order. The generated V2C messages including a magnitude and sign value are supplied to the V2C input 302 of the check node processing module 300. The messages are also supplied to constraint check module 408 while the soft/hard output ping pong buffer receives the sign bit associated with each generated V2C message. Constraint check module 408 checks to determine if the received message sign values corresponding to one iteration of the decoder graph, satisfy a predetermined decoding constraint, e.g., a parity check. If, at the end of a message passing iteration wherein one full set of V2C and C2V messages have been generated, the constraint check module 408 determines where or not the parity check is satisfied. Module 408 generates a decoding complete signal if it detects that the current message passing decoding iteration has resulted in successful decoding or, if decoding has not been determined to be successful, generates an iteration complete signal. The signal generated by the constraint check module 408 is supplied to the iteration control logic 410. At the end of each iteration, the stored sign values corresponding to the edges of the graph can be output from output buffer 412 as soft decisions assuming the constraint check has not been satisfied or as hard decisions in the event the constraint check has been satisfied.

Iteration control logic 410 will signal unsuccessful decoding, as a timeout signal, after a preselected number of message passing iterations which have not resulted in the parity check signal being satisfied, or signal successful decoding if the parity check is satisfied prior to the timeout. Thus, control logic 410 includes a timeout function which will terminate decoding I the event decoding is not successfully completed within a preselected number of decoding iterations.

The LDPC decoder 400 performs both variable and check node processing operations in variable node edge order thereby reducing or eliminating the need for message storage between the variable node and check node processing elements 308, 404 as compared to other systems where check node processing is performed in check node edge order and variable node processing is performed in variable node edge order. Furthermore, as will be discussed below, by careful selection of LDPC graph structure, there can be an overlap in processing of each iteration of an LDPC graph structure without the need for providing a full set of duplicate constraint node state memory entries 321, 323.

A decoding iteration using the decoder 400 may proceed as follows. Variable nodes are updated one at a time. Messages are read from check node output state memory and sign memory and outgoing check node messages are produced. These messages are summed at the variable nodes and subsequently subtracted from the sum, following standard variable node processing. As the outgoing messages are produced they are sent directly to the check node processor, which also retrieves the corresponding partial state from memory. The state is updated and returned to partial state memory. If the V2C message is the last one for that constraint in the current iteration, then the state may be written to output state memory and the partial state memory is reset.

Figure 5:
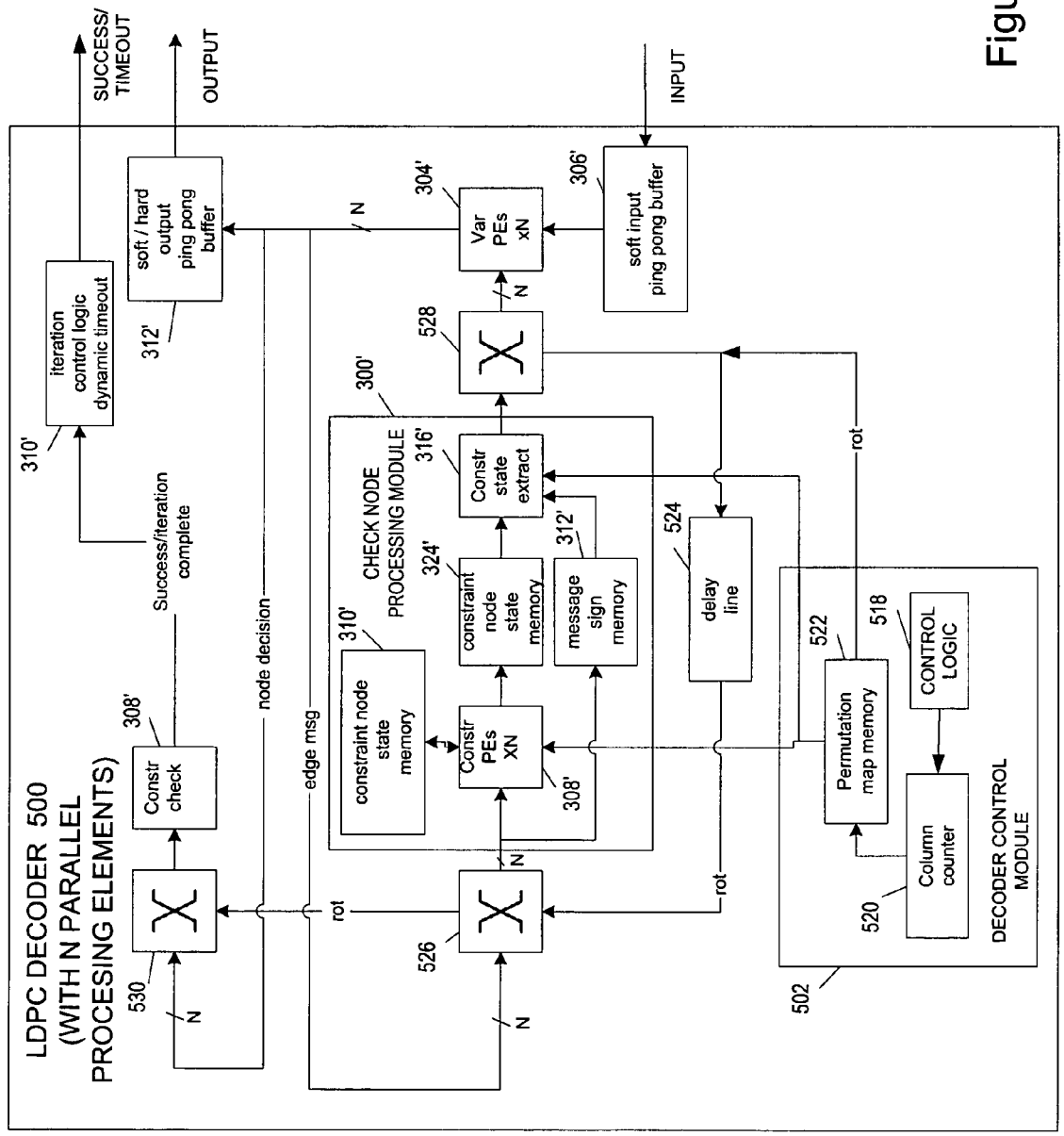
FIG. 5 illustrates another LDPC decoder implemented using N parallel constraint node and variable node processing elements in accordance with the present invention.

The check node processing module 300 of the present invention and general LDPC decoder system shown in FIG. 4 can be easily adapted in accordance with the present invention to support the use of multiple constraint node and variable node processing elements which are arranged and work in parallel. In FIG. 5, the decoder 500 operates using N constraint node, constraint state extraction circuits, and variable node processing elements in parallel. In FIG. 5, constraint check module 308', iteration control logic 310', and buffers 312' and 306' operate in the same or similar manner to the similarly numbered elements described in regard to FIG. 4. Other elements in check node processing module 300' also work in the same or similar manner as described with like numbered elements of FIG. 4 which do not include the '. However, in the FIG. 5 embodiment, element 308' includes N constraint processors 308 arranged in parallel while constraint node state memory 324 is also designed to work with N times as many sets of check node state while constraint state extraction module 316' include N message extraction circuits. Note that memory 310' while supporting accessing of N sets of state information at a time does not have to include any additional state entries as compared to the FIG. 4 embodiment since the number of state entries is determined by the number of check nodes in a graph and not how many nodes are implemented in parallel.

The FIG. 5 embodiment includes a decoder control module 502 designed to support N wide decoding operations based on use of a small graph description and control information on how to modify the small graph to generate a larger graph intended to control decoding. The modifications to the small graph may be embodied as reordering, e.g., rotations, of messages being passed between variable and check node processing elements where sets of N messages are passed in parallel. In particular, in the FIG. 5 embodiment, switches 530, 526, 528 are used to control reordering of messages as they are passed between various elements of the decoder 500. The reordering is a function of graph description information stored in control logic 518 and rotation signals generated by permutation map 522, as a function of a column counter 520 driven by control logic 518. Rotation control signals used to control reordering of messages supplied to the check node processing module 300' are generated by delaying by use of delay line 524, some of rotation signals used to control variable the reordering of messages supplied to the input of variable pressing elements 504.

Having described a check node processor module 300 and various LDPC decoders 400 and 500 implemented in accordance with the present invention, various features regarding graph design, LDPC code structure and decoding implementations using particular graph structures in decoders implementing the present invention will now be discussed.

When implementing a decoder such as depicted in FIGS. 5 for high speed applications, the small graph which is described by the stored graph description information which is sometimes referred to as a projected graph will typically be quite small, i.e., it will have a small number of variable nodes. As depicted the architecture performs one projected edge update per clock cycle which corresponds to processing N messages during each clock cycle. If decoding of a complete graph iteration must finish before the next can begin, delays will be introduced into the decoding system. This can induce an inefficiency in the case of long pipeline delay, e.g., in the case of large graphs. The pipeline delay is the additional clock cycles needed to complete the decoding operations on each of the edges after each edge has initiated processing. If the pipeline delay is large relative to the projected graph size then this additional delay can significantly slow down the decoder.

By judicious graph design, however, one can ameliorate the delay problem whether it occurs in the decoder 400 or the parallel decoder 500.

Suppose the set of projected variable nodes V can be partitioned into multiple sets, e.g., at least sets SV1 and SV2 where SV1 precedes SV2 and the set of projected check nodes C can be partitioned into at least two sets SC1 and SC2 so that check nodes in SC1 connect by edges in the graph only to variable nodes in SV1. Then, if the processing is performed in variable node order, messages corresponding to variable node V1 will be processed first, followed by messages corresponding to variable node V2, followed by messages from variable node V3 and so on. In such a case, processing of messages corresponding to the first set of check nodes SC1 will have been completed by the time the last message corresponding to the last variable node in SV1 has been processed or before if the last check node in SC1 does not connect to the last edge of last variable node in SV2. The resulting fully completed state corresponding to check nodes in set SC1 can be stored in the check node state memory for use in generating V2C messages while processing on V2C messages from variable node V1 for the next graph iteration begins. Thus, the next iteration of graph processing can begin while the constraint node processing module 300 is still processing V2C messages corresponding to the uncompleted iteration of graph processing.

This is because when processing of messages from the set of variable nodes SV1 begins in iteration n+1, constraints in C1 have already been fully updated in iteration n. Constraining the graph to have this type of partition allows the subsequent iterations to overlap in time and one can effectively reduce and/or eliminate the penalty due to the pipeline delay.

Figure 6:
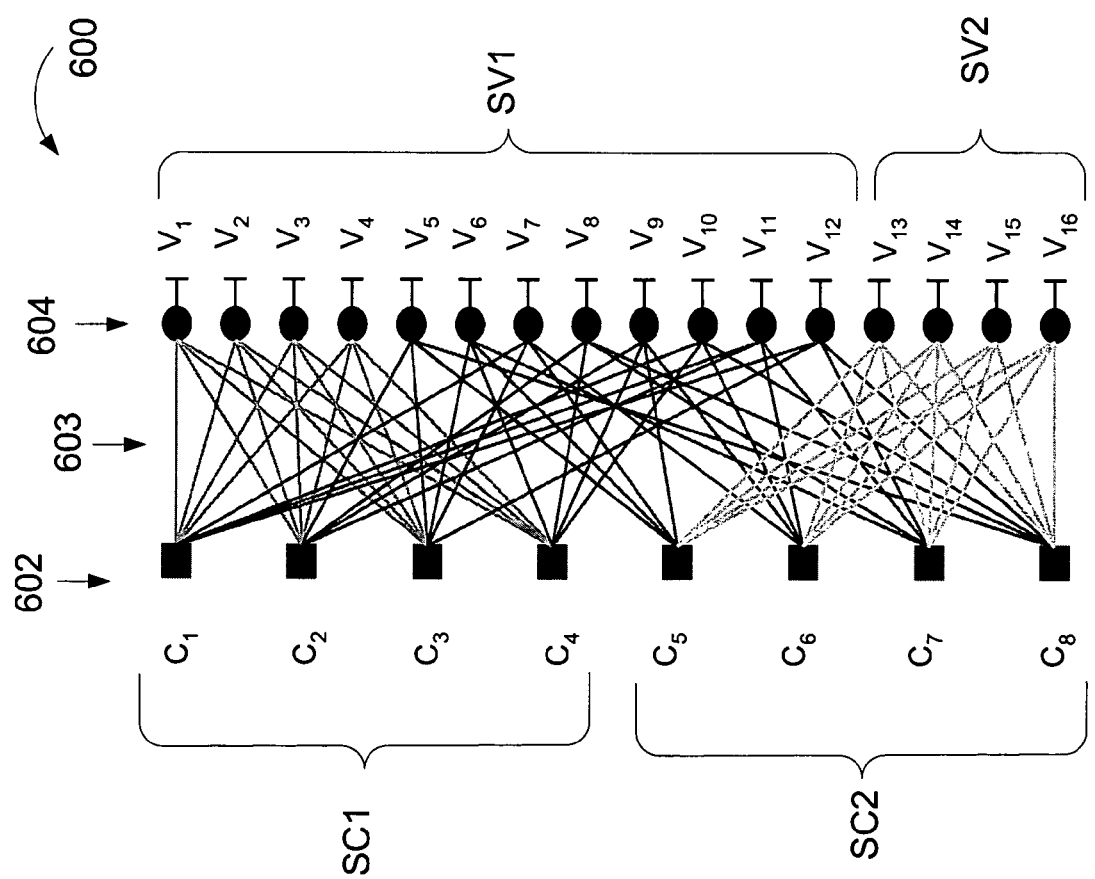
FIG. 6 illustrates an exemplary LDPC code structure which can be used to control decoding in, for example, the decoder of FIG. 4.

An LDPC code and corresponding graph structure 600 with such properties is shown in FIG. 6. In FIG. 6, the graph includes 8 check nodes 602 identified as $C_1$ through $C_8$ and 16 variable nodes 604 identified as $V_1$ through $V_{16}$. Note that by the time the messages from variable nodes $V_1$ through $V_{12}$ included in variable node set SV1 are processed by the constraint node processor module 300, the state corresponding to the first 4 constraint nodes $C_1$ through $C_4$ will have been fully updated. This fully updated state can be transferred to constraint node buffer memory 314 freeing up the constraint node entries corresponding to constraint nodes $C_1$ through $C_4$ to be used in the next iteration of graph processing. Thus, as processing in regard to constraint nodes in set SC2, i.e., constraint nodes C5, C6, C7 and C8 continues for one iteration, the C2V messages for that iteration corresponding to nodes in set SC1 will be generated while, at the same time constraint node processing for the next iteration can begin overlapping the ongoing processing associated with the current iteration.

The LDPC decoder methods and apparatus of the present invention are particularly well-suited for high rate codes where the number of check nodes is often substantially smaller than the number of edges in the graph. In such a case the state memory used in accordance with the invention will tend to be substantially smaller than the edge memory that would otherwise be required if complete messages were stored for constraint node processing purposes.

Figure 7:
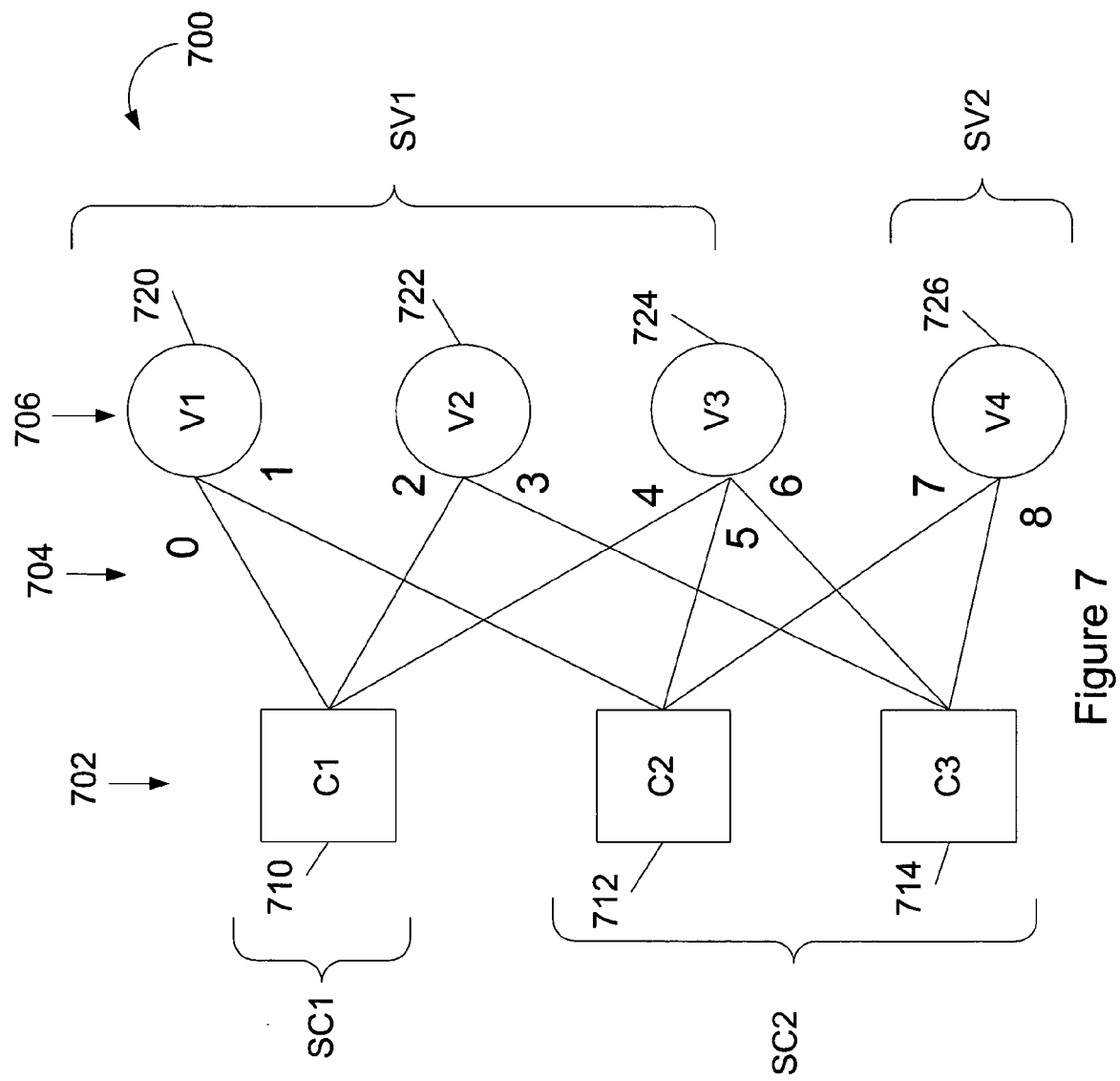
FIG. 7 illustrates another exemplary LDPC code structure which can be used to control decoding in, for example, the exemplary decoder of FIG. 4, in accordance with the invention.

FIG. 7 illustrates a relatively simple graph which will be used to explain decoder processing, e.g., processing which occurs when the decoder 400 of FIG. 4 is used to decode an exemplary set of input data having the message values 0, –1, 5 and 4 which are loaded into the variable nodes during the first processing iteration of the graph.

In FIG. 7, the graph 700 includes a total of three check nodes 702 and four variable nodes 706 coupled together by 9 edges number in variable node order from 0 to 8. Note that if the edges were numbered from the check node side the edges would have a different numbering sequence since they appear at the check nodes in a different order than at the variable nodes. Messages are passed back and fourth between the variable nodes 706 and check nodes 702 along the illustrated edges. The check nodes 702 include first through third check nodes 710, 712, 714 while the variable nodes 706 includes first through fourth variable nodes 720, 722, 724, 726.

Figure 8:
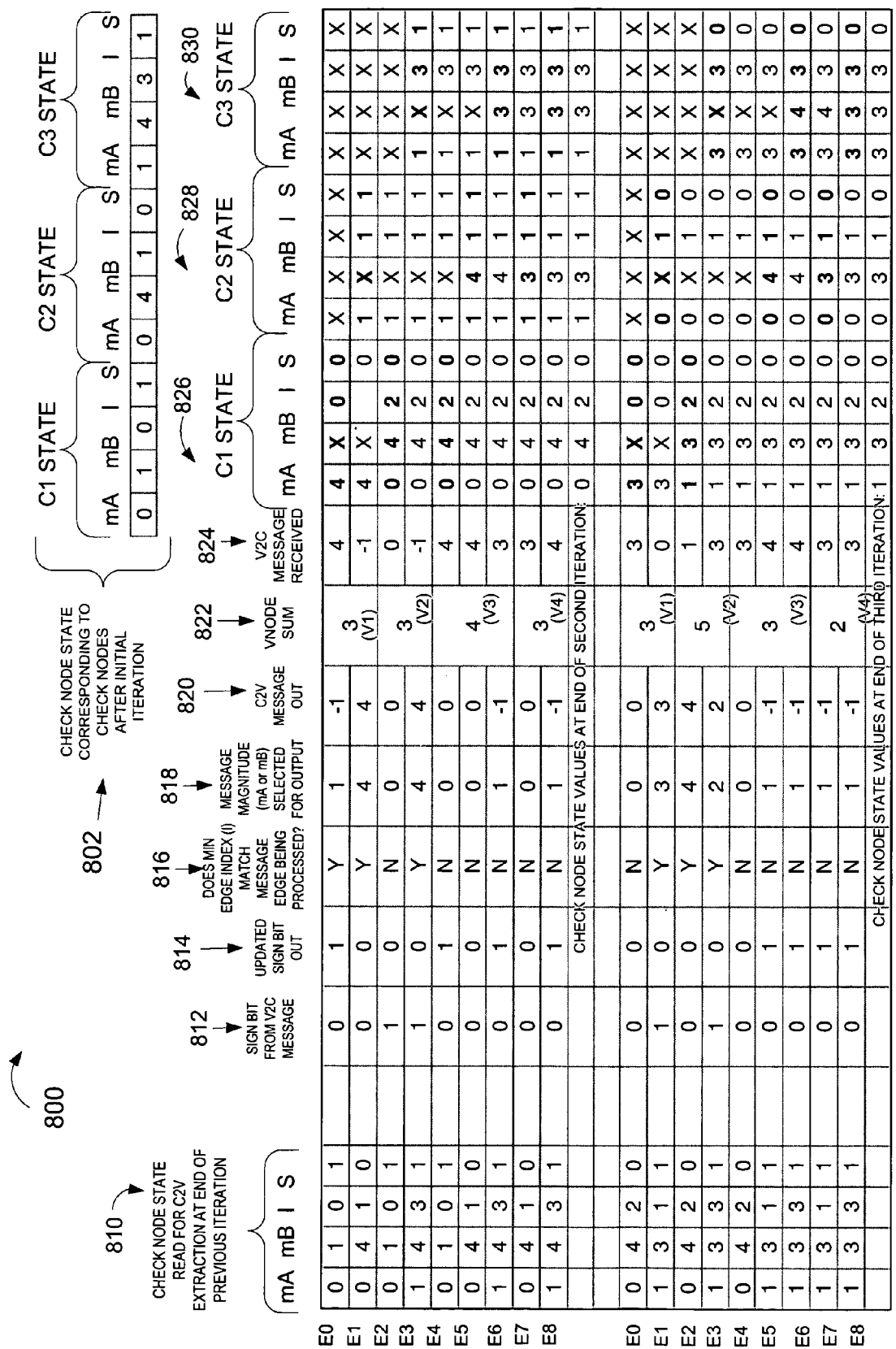
FIG. 8 illustrates the results of performing a decoding operation on a set of input values using the decoder of FIG. 4 and the LDPC code structure illustrated in FIG. 7.

Various resulting values of using the decoder 400 and the code structure shown in FIG. 7 are shown in FIG. 800. FIG. 800 illustrates the results of two full decoder processing iterations which follow the initial iteration used to load the received messages (0, –1, 5 and 4) into the decoder 400 and initially process the messages. A negative is used before the second input value to indicate a negative sign bit, equivalently a 1 bit, associated with the message while no negative sign indicates a positive sign bit, equivalently a 0 bit. Thus, the second message –1 has a negative sign bit while the first, third and fourth input messages have a positive sign bit. At the end of the first processing iteration, the state memory entries corresponding to check nodes C1, C2 and C3 will include the values shown at the top of FIG. 8 in the set of state memory entry values 802.

An iteration begins with the extraction of V2C messages. In the initial iteration the extracted C2V messages are set to 0. These messages are summed at the variable nodes as part of the current iteration and V2C are generated. These messages are received by a check node processor that updates the check node state associated with the current iteration. The iteration is complete when all check node states have been updated.

In the chart below the set of state memory entry values 802, each row corresponds to the processing associated with a different message edge, e.g., with the extraction of a C2V message, the generation of a V2C message to be transmitted along the indicated edge and an update of the check node state associated to the given edge. Each iteration of the graph involves the generation and processing one C2V message per edge of the FIG. 7 graph and the generation and processing of one V2C message for each edge.

Generally, columns 810, 812, 816, 818, and 820 illustrate C2V message extraction using the results of processing which occurred in the previous decoder iteration. Column 822 shows the variable node sums which are the sums of all incoming messages to the variable node and the received value associated to the variable node.

Column 824 shows the V2C message which will be generated along the corresponding edge in this iteration. It is equal to the variable node sum minus the incoming C2V message. These C2V messages will be received by the constraint node processor and used to update state information as shown in columns 826, 828, 830. Columns 826, 828, 830 show how the check node processor state is updated during a current processing iteration in response to receiving each V2C message shown in Column 824.

Information 810 shows the check node state generated during the preceding graph processing iteration read from the constraint node buffer state memory 314 to generate C2V messages. This fully updated state corresponding to each check node which is generated during the previous processing iteration is used to generate the C2V messages that are processed by the variable node processor 304 in the current graph iteration to generate the V2C messages. Column 812 illustrates the sign bit corresponding to the V2C message from the previous iteration along an edge which is retrieved from the sign bit memory 312 to construct the C2V message in the current processing iteration which will be the input to the variable node processor which generates the V2C message for the current processing iteration. Column 814 illustrates the updated sign bit generated by the constraint state extracted by XORing the stored sign bit 812 from the previously received V2C message with the stored accumulated sign bit S, generated in the previous iteration and obtained from the state corresponding to the check node (C1, C2 or C3) to which the message edge associated with the C2V message corresponds. Column 816 indicates the result of the check performed by the constraint state extractor to determine if the first minimum $m_A$ or the second minimum $m_B$ should be output during the previous processing iteration. The check involves comparing the edge index of the C2V message being generated with the edge index I corresponding to the stored first minimum. Here a "Y" indicates a "yes," meaning the edge index does correspond to the edge that transmitted the minimum magnitude in the previous iteration, and a "N" indicates a "no," meaning the edge index does not correspond to the edge that transmitted the minimum magnitude in the previous iteration. Column 812 illustrates the result of selecting $m_A$ or $m_B$ to be used as the magnitude of the outgoing C2V message. Column 820 shows the actual C2V message which will be transmitted on the indicated edge for use by the variable node processor 304 during the current iteration. The variable node processor 304 generates a sum of C2V messages received during a processing iteration. The resulting VNode sum shown in column 822 is then used for generating the V2C message to be supplied to the constraint processor module 300 along a message edge, e.g., for constraint node processing during the current iteration.

From the constraint node processing module perspective, the information shown in cols. 810, 812, 814, 816, 818, 820 and 822 represent operations which derive from result computed in a previous graph processing iteration. As discussed above, given careful graph design, there may be some overlap in when these operations occur for one graph processing iteration and when updating of message state for the next iteration of constraint node processing occurs.

Col. 824 illustrates the V2C message which will be received and processed during the second and third constraint node processing module iterations corresponding to processing the exemplary input using the graph structure shown in FIG. 7. Each graph iteration involves processing of nine V2C messages corresponding to the messages passed on the edges E0 through E8. The processing of messages by the constraint processing module 300 occurs in variable node edge order. At the start of processing, the constraint memory corresponding to the check nodes will have been re-initialized. Assuming no overlap in processing iterations, the state for each of check nodes C1, C2 and C3 will have been re-initialized prior to receipt of the first V2C message corresponding to edge E0. Each of the columns 826, 828, 830 shows the stored state corresponding to one of the check nodes C1, C2, C3, respectively, after it is updated by the received V2C message with each row corresponding to the processing of a different V2C message. State contents updated in response to a particular message, e.g., the message communicated on the edge to which the row corresponds, are shown in bold. X's are used in the columns 826, 828, 830 to show values which have been set to an initial value. These values are "don't care" values since they will not be used in the generated C2V output message.

Note that at the end of the second iteration, the fully updated message state C1, C2, C3 will have been updated to the values for C1 ($m_A$=0,$m_B$=4, I=2, S=0); C2 ($m_A$=1,$m_B$=3, I=2, S=0); S=1); and C3 ($m_A$=1,$m_B$=3, I=3, S=1). At the end of the third iteration, the fully updated message state C1, C2, C3 will have been updated to the values for C1 ($m_A$=1, $m_B$=3, I=2, S=0); C2 ($m_A$=0,$m_B$=3, I=1, S=0); and C3 ($m_A$=3,$m_B$=3, I=3, S=0).

While the state is not shown as being cleared after processing of messages corresponding to a check node has been completed, in embodiments where there is overlap between graph processing iterations, the reset of the state corresponding to a fully updated constraint node would be stored in the constrain node state buffer memory 324 and the state information reset in the constraint state memory. In the example shown in FIG. 8 such resetting is not shown simply to facilitate understanding of the constraint state update sequence and how a complete set of updated state is generated during the processing associated with a complete graph iteration.

Given various code structures with which the decoder and decoding methods of the present invention can be used, a great deal of flexibility with regard to the amount of overlap which can occur between processing iterations is possible. To reduce decoding delays overlaps with regard to performing check node processing corresponding to different decoder iterations the code structure can be selected to allow 10%, 20%, 30%, 40% or more overlap in graph processing iterations.

Various exemplary decoding method implementations and exemplary variations will node be described.

One particular exemplary method of performing Low Density Parity Check Decoding operations, includes the steps of: storing in a memory message state information corresponding to messages received by a plurality of check nodes; receiving a check node input message directed to one of said plurality of check nodes; selecting, based on the check node to which said received message is directed, one of said plurality of sets of state information to be used in a state update operation; retrieving from said memory the selected set of message state information; and updating the selected set of message state information as a function of said received message. The method further includes the step of writing said updated set of message state information into the memory location from which said message state information was retrieved and repeating said receiving, selecting, retrieving and updating steps sequentially for each of a plurality of messages received in a first sequence corresponding to the order in which edges corresponding to said received messages are attached to variable processing nodes in a graph representing an LDPC code. In some implementations the sequence corresponding to the order in which edges corresponding to said received messages are attached to variable processing nodes in a graph representing said LDPC code is different from a second sequence in which edges corresponding to said received messages are attached to constraint processing nodes in a graph representing said LDPC code. The exemplary method further includes performing a check node to variable node message extraction operation on at least one set of state information corresponding to a check node for which a full set of variable to check node messages have been received wherein the extraction operation is performed multiple times to generate a plurality of check node to variable nodes messages, check node to variable node messages directed to an individual one of said plurality of variable nodes being generated consecutively to produce a sequence of check node to variable node messages directed to said individual one of said plurality of variable nodes.

In the exemplary method, fully updated state is generated for each check node prior to the fully updated state being stored in a buffer memory for use in the C2V message extraction process. Fully updated state is state which has been updated by the full set of V2C messages corresponding to the check node to which the state corresponds. Multiple sets of state will be updated during the processing corresponding to a full graph. Multiple decoding iterations corresponding to a graph are normally performed with each iteration corresponding to the processing of one full set of messages in the graph used to represent the LDPC code used to control decoding. Check node state can be updated corresponding to different graph processing iterations during the same period of time assuming that the check node state for the subsequent iteration was fully updated already during the previous iteration.

Thus, in some implementations, the method includes updating another set of state corresponding to said first check node as part of a second iteration of variable to check node message processing, prior to fully completing said state update of said at least one other check node, e.g., the last check node in the graph, during said first iteration of decoder processing.

As part of the decoding method to facilitate overlap of iterations of graph processing, in some embodiments the method further includes buffering said fully updated state corresponding to said first check node; and extracting check node to variable node messages from said buffered fully updated state. The step of extracting check node to variable node messages from said buffered fully updated state includes, in some implementations, generating a plurality of outgoing messages from said fully updated state and stored sign information corresponding to a plurality of variable node to check node messages used to generate said fully updated state.

Some exemplary decoding methods include fully completing the state update for a first plurality of check nodes prior to completing state updates corresponding to a second plurality of check nodes, a state update for a check node being fully completed when the state for the check node has been updated once for each one of a plurality of message edges corresponding to said check node. In some embodiments the first and second pluralities of check nodes each include at least 20% of the total number of check nodes in an LDPC graph representing an implemented LDPC code structure being used to control decoding.

The state update operation may be performed as part of updating state corresponding to a first set of check nodes. In some implementations the updating of the first set of check nodes is performed during a first period of time using a first set of variable to check node messages, with the method further including: updating state information corresponding to a second set of check nodes during a second period of time, said second set of check nodes including only check nodes which are not included in said first set of check nodes, said second period of time following said first period of time. In such implementations check node information may be extracted at different times. In one implementation the method includes extracting check node to variable node messages from the updated state information corresponding to said first set of check nodes during said second period of time. In some implementations which implement this timing feature the first and second periods of time are equal in length. The first and second periods of time may, and often are, separated by a third period of time wherein state corresponding to a third set of check nodes is updated. This is often the case where large graphs including many nodes are used. In some implementations the first and second sets of check nodes each include at least 10% of the check nodes in a graph corresponding to an LDPC code being used to control decoding. In other implementations the first and second sets of check nodes each include at least 20% of the check nodes in a graph corresponding to an LDPC code being used to control decoding. In some implementations the first period of time is less than 40% of the time required to processes N variable to check node messages where N is equal to the total number of message edges in a graph corresponding to an LDPC code being used to control decoding while in other embodiments the first period of time is less than 20% of the time required to processes N variable to check node messages where N is equal to the total number of message edges in a graph corresponding to an LDPC code being used to control decoding.

Numerous variations on the above described methods and apparatus are possible while remaining within the scope of the invention. For example while using compressed state about messages, the sign information for C2V messages may be generated in a slightly different manner than described above while still staying within the scope of the invention. An alternative implementation uses a ping-pong structure in which one memory is used for state memory while the other contains complete states from the previous iteration and, at the end of an iteration, the roles of the buffers are reversed. In such embodiment the sign bits would be handled as follows. The signs of V2C messages are stored. In addition to the reliability information the XOR of incoming sign bits is also maintained as part of the state. When the C2V messages are extracted, the stored V2C sign is XORED with the cumulative X-OR in the state to yield the C2V message sign bit. Note that once it is read, the V2C sign bit is no longer needed so the V2C sign bit that will soon be produced by the variable node processor may subsequently overwrite it.

The above-described methods may be implemented in a computer system that includes memory, a CPU and one or more input and/or output devices coupled together. In such an embodiment, the memory includes a routine implemented in accordance with the invention. When executed, the routine causes the CPU to receive, process, e.g., decode, and output data in accordance with the present invention. Alternatively, the steps of the present invention may be implemented using dedicated hardware, e.g., circuits and/or a combination of hardware and software.

What is claimed:

1. An apparatus for performing Low Density Parity Check (LDPC) decoding operations, comprising:
   a check node processor module including:
   i) check node state memory including a plurality of message state memory storage elements for a plurality of check nodes, each check node state storage element corresponding to a single check node and including a first and a second location for storing first and second message magnitude values corresponding to messages directed to the check node to which said check node state memory corresponds, each node state storage element further including a sign memory location for storing an accumulated sign value corresponding to the check node to which the check node state storage element corresponds;
   ii) a check node processor element for updating state stored in said check node state memory based on the content of a received variable node to check node state message; and
   iii) a control module coupled to said check node state memory for controlling said check node state memory to output check node state, corresponding to the same check node as a variable to check node message to be processed, said check node state being output from the one of said check node state storage elements which corresponds to the same node as said variable to check node message to be processed.

2. The apparatus of claim 1, further comprising:
   a message sign memory for storing the sign bit included in each received message corresponding to a check node for use in generating check node to variable node messages.

3. The apparatus of claim 2, further comprising:
   a check node state buffer memory for storing fully updated check node state information corresponding to at least one check node.

4. The apparatus of claim 3, wherein fully updated check node state information corresponding to the at least one check node is state information which has been generated from each of M variable node to check node messages, where M is the number of edges corresponding to said at least one check node.

5. The apparatus of claim 3, further comprising:
a check node to variable node message extractor coupled to said check node state buffer memory and to said message sign memory for generating check node to variable node messages from said fully updated check node state information corresponding to said at least one check node and from stored sign message information corresponding to said at least one check node, one check node to variable node message being generated for each received check node to variable node message that was received corresponding to said at least one check node.

6. The apparatus of claim 5, wherein said control module controls said check node state memory to store updated state corresponding to a check node in the same message state memory storage element from which state information corresponding to said check node was read.

7. The apparatus of claim 2, where said message sign memory includes one sign bit storage location for each message edge included in an LDPC graph structure used to control decoding.

8. The apparatus of claim 7, further comprising:
a variable node processor coupled to said check node processing module, said variable node processor module receiving check node to variable node messages from said check node processing module and generating variable node to check node messages supplied to said check node processing module.

9. The apparatus of claim 8, further comprising:
a decoder control module coupled to said check node processing module and to said variable node processor module, said decoder control module control both said check node processing module and said variable node processor module to process messages in variable node order.

10. The apparatus of claim 9, wherein said variable node processor includes a plurality of variable node processing elements arranged in parallel.

11. The apparatus of claim 10, wherein said check node processor module includes a plurality of check node processing elements arranged in parallel.

12. The apparatus of claim 11, wherein there is at least one message reordering element arranged between said variable node processor module and said check node processor module for reordering messages passed in parallel between said variable node processor and said check node processor.

13. The apparatus of claim 12, wherein said decoder control module includes control logic for controlling the message reordering element as a function of stored message reordering information.

14. The apparatus of claim 1, where said check node state memory includes one check node state memory storage element for each check node included in an LDPC graph structure used to control decoding.

15. The apparatus of claim 1, where said check node state memory includes one check node state memory storage element for each check node included in an LDPC graph structure used to control decoding.

16. A method of performing Low Density Parity Check Decoding operations, comprising the steps of:
storing in a memory message state information corresponding to messages received by a plurality of check nodes;
receiving a check node input message directed to one of said plurality of check nodes;
selecting, based on the check node to which said received message is directed, one of said plurality of sets of state information to be used in a state update operation;
retrieving from said memory the selected set of message state information; and
updating the selected set of message state information as a function of said received message.

17. The method of claim 16, further comprising:
writing said updated set of message state information into the memory location from which said message state information was retrieved.

18. The method of claim 17, further comprising:
repeating said receiving, selecting, retrieving and updating steps sequentially for each of a plurality of messages received in a first sequence corresponding to the order in which edges corresponding to said received messages are attached to variable processing nodes in a graph representing an LDPC code.

19. The method of claim 18, wherein said sequence corresponding to the order in which edges corresponding to said received messages are attached to variable processing nodes in a graph representing said LDPC code is different from a second sequence in which edges corresponding to said received messages are attached to constraint processing nodes in a graph representing said LDPC code.

20. The method of claim 18, further comprising:
performing a check node to variable node message extraction operation on at least one set of state information corresponding to a check node for which a full set of variable to check node messages have been received.

21. The method of claim 20, further comprising:
performing said extraction operation to generate a plurality of check node to variable nodes messages, check node to variable node messages directed to an individual one of said plurality of variable nodes being generated consecutively to produce a sequence of check node to variable node messages directed to said individual one of said plurality of variable nodes.

22. The method of claim 16, further comprising:
fully completing the state update of a first check node to generate a set of fully updated state corresponding to said first check node, prior to completing the state update of at least one other check node, a state update for a check node being fully completed when the state for the check node has been updated once for each one of a plurality of message edges corresponding to said check node.

23. The method of claim 16, further comprising:
updating another set of state corresponding to said first check node as part of a second iteration of variable to check node message processing, prior to fully completing said state update of said at least one other check node.

24. The method of claim 23, further comprising the step of:
buffering said fully updated state corresponding to said first check node; and
extracting check node to variable node messages from said buffered fully updated state.

25. The method of claim 24, wherein said step of extracting check node to variable node messages from said buffered fully updated state includes:
 generating a plurality of outgoing messages from said fully updated state and stored sign information corresponding to a plurality of variable node to check node messages used to generate said fully updated state.

26. The method of claim 16, further comprising:
 fully completing the state update for a first plurality of check nodes prior to completing state updates corresponding to a second plurality of check nodes, a state update for a check node being fully completed when the state for the check node has been updated once for each one of a plurality of message edges corresponding to said check node.

27. The method of claim 26, wherein the first and second pluralities of check nodes each include at least 20% of the total number of check nodes in an LDPC graph representing an implemented LDPC code structure being used to control decoding.

28. The method of claim 16, wherein said updating operation is performed as part updating state information corresponding to a first set of check nodes.

29. The method of claim 28, wherein said updating of a first set of check nodes is performed during a first period of time using a first set of variable to check node messages, the method further comprising:
 updating state information corresponding to a second set of check nodes during a second period of time, said second set of check nodes including only check nodes which are not included in said first set of check nodes, said second period of time following said first period of time.

30. The method of claim 29, further comprising:
 extracting check node to variable node messages from the updated state information corresponding to said first set of check nodes during said second period of time.

31. The method of claim 30, wherein said first and second periods of time are equal in length.

32. The method of claim 30, wherein said first and second periods of time are separated during a third period of time wherein state corresponding to a third set of check nodes is updated.

33. The method of claim 30, wherein said first and second sets of check nodes each include at least 10% of the check nodes in a graph corresponding to an LDPC code being used to control decoding.

34. The method of claim 30, wherein said first and second sets of check nodes each include at least 20% of the check nodes in a graph corresponding to an LDPC code being used to control decoding.

35. The method of claim 30, wherein said first period of time is less than 40% of the time required to processes N variable to check node messages where N is equal to the total number of message edges in a graph corresponding to an LDPC code being used to control decoding.

36. The method of claim 30, wherein said first period of time is less than 20% of the time required to processes N variable to check node messages where N is equal to the total number of message edges in a graph corresponding to an LDPC code being used to control decoding.

* * * * *